United States Patent
Xiao et al.

(10) Patent No.: US 12,369,425 B2
(45) Date of Patent: Jul. 22, 2025

(54) METHOD FOR PREPARING ELECTRODE FILM LAYER ON SURFACE OF SOLAR CELL SUBSTRATE

(71) Applicant: Huaneng Clean Energy Research Institute, Beijing (CN)

(72) Inventors: Ping Xiao, Beijing (CN); Jiguang Xiong, Beijing (CN); Zhiguo Zhao, Beijing (CN); Jialiang Liu, Beijing (CN); Mengjie Li, Beijing (CN); Dongming Zhao, Beijing (CN); Xiaojun Qin, Beijing (CN); Yun Zhang, Beijing (CN); Chao Dong, Beijing (CN); Xueling Wang, Beijing (CN); Shisen Xu, Beijing (CN); Ruwei Liu, Beijing (CN); Sichao Liang, Beijing (CN)

(73) Assignee: Huaneng Clean Energy Research Institute, Beijing (CN)

( * ) Notice: Subject to any disclaimer, the term of this patent is extended or adjusted under 35 U.S.C. 154(b) by 84 days.

(21) Appl. No.: 18/449,506

(22) Filed: Aug. 14, 2023

(65) Prior Publication Data

US 2023/0387342 A1    Nov. 30, 2023

Related U.S. Application Data

(63) Continuation of application No. PCT/CN2022/101421, filed on Jun. 27, 2022.

(30) Foreign Application Priority Data

Oct. 14, 2021  (CN) .......................... 202111198189.6

(51) Int. Cl.
| | | |
|---|---|---|
| H01L 31/18 | (2006.01) | |
| H01L 31/0224 | (2006.01) | |
| H01L 31/032 | (2006.01) | |
| H10F 71/00 | (2025.01) | |
| H10F 77/12 | (2025.01) | |
| H10F 77/20 | (2025.01) | |

(52) U.S. Cl.
CPC ......... *H10F 71/137* (2025.01); *H10F 71/121* (2025.01); *H10F 77/12* (2025.01); *H10F 77/211* (2025.01)

(58) Field of Classification Search
CPC ......... H01L 31/1876; H01L 31/022425; H01L 31/032; H01L 31/1804; H10K 30/81; H10K 30/40; Y02E 10/547; Y02E 10/549; Y02P 70/50; C23C 26/02
See application file for complete search history.

(56) References Cited

U.S. PATENT DOCUMENTS

| | | | |
|---|---|---|---|
| 4,336,277 A | 6/1982 | Bunshah et al. | |
| 2015/0279573 A1* | 10/2015 | Horiuchi | H01G 9/2059 |
| | | | 136/263 |

FOREIGN PATENT DOCUMENTS

| | | |
|---|---|---|
| CN | 106684247 A | 5/2017 |
| CN | 110061136 A | 7/2019 |
| CN | 110246926 A | 9/2019 |
| CN | 112831756 A | 5/2021 |
| CN | 113930763 A | 1/2022 |
| WO | 2021193990 A1 | 9/2021 |

OTHER PUBLICATIONS

Erck, Uses of Ion Bombardment in Thin-Film Deposition, 1990 (Year: 1990).*

* cited by examiner

*Primary Examiner* — Angelo Trivisonno

(57) ABSTRACT

The disclosure provides a method for preparing an electrode film layer on a surface of a solar cell substrate. The method includes: a) obtaining a metal electrode material melt by heating and melting a metal electrode material under a vacuum condition; b) bombarding the metal electrode material melt with an ion source at low energy, so that it is sputtered and deposited on the surface of the solar cell substrate to form the electrode film layer; in which the energy of low energy bombarding is 30 eV to 80 eV.

14 Claims, No Drawings

METHOD FOR PREPARING ELECTRODE FILM LAYER ON SURFACE OF SOLAR CELL SUBSTRATE

CROSS-REFERENCE TO RELATED APPLICATION

This application is a continuation of PCT/CN2022/101421, filed on Jun. 27, 2022, which claims priority to Chinese Patent Application No. 202111198189.6, filed on Oct. 14, 2021, titled "A Method for Preparing an Electrode Film Layer on a Surface of a Solar Cell Substrate", the entire contents of which are incorporated herein by reference.

TECHNICAL FIELD

The present disclosure belongs to the field of solar cell technology, in particular to a method for preparing an electrode film layer on a surface of a solar cell substrate.

BACKGROUND

With the realization that petroleum and chemical resources are non-renewable and limited resources, and accompanied by global environmental pollution and ecological damage, countries around the world have begun to strengthen the development of clean energy, which has driven the development of solar cells with increasing efficiency. The efficiency of single crystal silicon cells has increased from 6% in the 1950s to 24.7% at present, and the efficiency of polycrystalline silicon cells has reached 20.3%. In the study of thin film cells, the efficiency of amorphous silicon thin film cells has reached 13%, the efficiency of cadmium telluride (CdTe) has reached 16.4%, and the efficiency of copper indium selenium (CIS) has reached 19.5%. The research on multi-junction tandem photoelectric cells has made great progress, and the conversion efficiency of GaInP/Ga(In)As/Ge multi-junction photoelectric cells under concentrated light conditions has exceeded 40%.

The preparation process of solar cells involves the deposition of electrode materials on the surface of the substrate. A common electrode material deposition method is thermal evaporation, but the method requires a higher temperature and generates larger thermal radiation, which can cause damage to the substrate material (e.g., a perovskite material layer).

SUMMARY

In view of this, an object of the present disclosure is to provide a method for preparing an electrode film layer on a surface of a solar cell substrate, which effectively reduces the damage to the solar cell substrate during the preparation of the electrode film layer.

The present disclosure provides a method for preparing an electrode film layer on a surface of a solar cell substrate. The method includes: a) obtaining a metal electrode material melt by heating and melting a metal electrode material under a vacuum condition; b) bombarding the metal electrode material melt with an ion source at low energy, so that it is sputtered and deposited on the surface of the solar cell substrate to form the electrode film layer; in which energy of low energy bombarding is 30 eV to 80 eV.

In some embodiments, at step a), the vacuum condition is $5 \times 10^{-5}$ Pa to $5 \times 10^{-3}$ Pa.

In some embodiments, at step a), the vacuum condition is $1 \times 10^{-4}$ Pa to $1 \times 10^{-3}$ Pa.

In some embodiments, at step a), the metal electrode material is one or more of gold, silver, copper, iron, aluminum, cadmium, molybdenum, titanium, tin, tungsten, zinc, gallium, germanium, arsenic, selenium, rhodium, palladium, indium, antimony, osmium, iridium, platinum, thallium, bismuth, and polonium.

In some embodiments, at step a), the metal electrode material is one or more of gold, silver and copper.

In some embodiments, at step b), the ion source is an argon plasma source, a Hall ion source or a Kaufman ion source.

In some embodiments, at step b), the solar cell substrate is a substrate provided with a perovskite material layer.

In some embodiments, at step b), the solar cell substrate includes a hole transport layer, the perovskite material layer, and an electron transport layer that are in contact with each other.

In some embodiments, at step b), a deposition thickness is 50 nm to 300 nm.

In some embodiments, at step b), the deposition thickness is 100 nm to 200 nm.

In some embodiments, at step a), a heating and melting temperature is greater than a melting temperature of the metal electrode material under the vacuum condition, and less than a boiling temperature of the metal electrode material under the vacuum condition.

In some embodiments, in case that the metal electrode material is copper, the heating and melting temperature is 1060° C. to 1082° C.

In some embodiments, in case that the metal electrode material is gold, the heating and melting temperature is 1040° C. to 1064° C.

In some embodiments, in case that the metal electrode material is silver, the heating and melting temperature is 940° C. to 961° C.

Additional aspects and advantages of embodiments of present disclosure will be given in part in the following descriptions, become apparent in part from the following descriptions, or be learned from the practice of the embodiments of the present disclosure.

DETAILED DESCRIPTION

The following is a clear and complete description of the technical solutions in embodiments of the present disclosure. Obviously, embodiments described here are only part of embodiments of the present disclosure and are not all embodiments of the present disclosure. Based on embodiments of the present disclosure, other embodiments obtained by those skilled in the art without inventive works are within the protection scope of the present disclosure.

The present disclosure provides a method for preparing an electrode film layer on a surface of a solar cell substrate. The method includes:

a) obtaining a metal electrode material melt by heating and melting a metal electrode material under a vacuum condition; and b) bombarding the metal electrode material melt with an ion source at low energy, so that it is sputtered and deposited on the surface of the solar cell substrate to form the electrode film layer.

The energy of low energy bombarding is 30 eV to 80 eV.

Compared to the related art, the present disclosure provides the method for preparing the electrode film layer on the surface of the solar cell substrate. The method includes: a) obtaining a metal electrode material melt by heating and melting a metal electrode material under a vacuum condition; b) bombarding the metal electrode material melt with an ion source at low energy, so that it is sputtered and deposited on the surface of the solar cell substrate to form the electrode film layer. The energy of low energy bombarding is 30 eV to 80 eV. The method provided by the present disclosure does not require heating the electrode material to the evaporated state, which may significantly reduce the thermal radiation during the deposition of the electrode material and reduce the thermal radiation damage to the substrate. Meanwhile, since the method uses low-energy particle bombarding, it may also effectively avoid the impact damage to the substrate caused by high-energy particle bombarding. The method provided by the present disclosure effectively reduces the damage to the solar cell substrate during the preparation of the electrode film layer with low energy consumption, and has a good market prospect.

In the method provided by the present disclosure, at step a), the vacuum condition is preferably $5 \times 10^{-5}$ Pa to $5 \times 10^{-3}$ Pa, more preferably $1 \times 10^{-4}$ Pa to $1 \times 10^{-3}$ Pa. For example, it may be $1 \times 10^{-4}$ Pa, $2 \times 10^{-4}$ Pa, $3 \times 10^{-4}$ Pa, $4 \times 10^{-4}$ Pa, $5 \times 10^{-4}$ Pa, $6 \times 10^{-4}$ Pa, $7 \times 10^{-4}$ Pa, $8 \times 10^{-4}$ Pa, $9 \times 10^{-4}$ Pa or $1 \times 10^{-3}$ Pa.

In the method provided by the present disclosure, the metal electrode material includes, but is not limited to, one or more of gold, silver, copper, iron, aluminum, cadmium, molybdenum, titanium, tin, tungsten, zinc, gallium, germanium, arsenic, selenium, rhodium, palladium, indium, antimony, osmium, iridium, platinum, thallium, bismuth, and polonium. Preferably, the metal electrode material is one or more of gold, silver and copper.

In the method provided by the present disclosure, at step a), the heating and melting temperature is greater than the melting temperature of the metal electrode material under the vacuum condition, and less than the boiling temperature of the metal electrode material under the vacuum condition. In detail, when the metal electrode material is selected as copper, the heating and melting temperature is preferably 1060° C. to 1082° C. When the metal electrode material is selected as gold, the heating and melting temperature is preferably 1040° C. to 1064° C. When the metal electrode material is selected as silver, the heating and melting temperature is preferably 940° C. to 961° C.

In the method provided by the present disclosure, at step b), the ion source includes, but is not limited to, an argon plasma source, a Hall ion source or a Kaufman ion source.

In the method provided by the present disclosure, at step b), the energy of low energy bombarding is 30 eV to 80 eV, which may be 30 eV, 35 eV, 40 eV, 45 eV, 50 eV, 55 eV, 60 eV, 65 eV, 70 eV, 75 eV or 80 eV.

In the method provided by the present disclosure, at step b), the solar cell substrate is preferably a substrate provided with a perovskite material layer. More preferably, the solar cell substrate includes a hole transport layer, the perovskite material layer, and an electron transport layer that are in contact with each other.

In the method provided by the present disclosure, at step b), a deposition thickness is preferably 50 nm to 300 nm. More preferably, the deposition thickness is 100 nm to 200 nm. The deposition thickness may be 100 nm, 110 nm, 120 nm, 130 nm, 140 nm, 150 nm, 160 nm, 170 nm, 180 nm, 190 nm or 200 nm.

The method provided by the present disclosure firstly melts the electrode material by heating, and then bombards the metal electrode material melt with an ion source at low energy, so that it is deposited on the surface of the substrate. The method does not require heating the electrode material to the evaporated state, which can significantly reduce the thermal radiation during the deposition of the electrode material and reduce the thermal radiation damage to the substrate. Meanwhile, since the method uses low-energy particle bombarding, it may also effectively avoid the impact damage to the substrate caused by high-energy particle bombarding. This method effectively reduces the damage to the solar cell substrate during the preparation of the electrode film layer with low energy consumption, and has a good market prospect.

The present disclosure also provides an electrode film layer on a surface of a solar cell substrate, which is prepared by the above-mentioned method.

The present disclosure also provides a solar cell, which includes the above-mentioned electrode film layer. The electrode film layer is on a surface of a solar cell substrate. For clarity, the method is described in detail through the following examples.

Example 1

A $NiO_x$ hole transport layer is prepared on a surface of a substrate by a magnetron sputtering process. A perovskite material layer is prepared by a scraping process. A precursor of perovskite is $MAPbI_3$, at a ratio of $MAI:PbI_2=1:1$ (molar ratio), with a concentration of 1 mol/L, using Dimethyl Formamide (DMF) solvent. After annealing, a C60 electron transport layer is prepared by an evaporation process. Finally, an electrode is vaporized to obtain a cell sheet. The specific steps of electrode evaporation are provided as follows:
  a) A metal electrode material of copper is heated to 1060° C. to 1082° C. at a pressure of $1 \times 10^{-4}$ Pa, so as to make the metal electrode material of copper approaches or becomes a molten state;
  b) The melt of copper obtained at step a) is bombarded at low energy of 30 ev) by using the argon plasma source, so that it is sputtered and deposited on a surface of the transport layer of the substrate to form a copper electrode film layer with a thickness of 150 nm.

A temperature of a chamber and a temperature of the substrate are detected during the sputtering and deposition process, and the results are that the temperature of the chamber is 65.5° C., and the temperature of the substrate is 66.1° C.

Example 2

A $SnO_2$ electron transport layer and a perovskite material layer are prepared on a surface of a substrate in sequence by a spin coating process. A precursor of perovskite is $MAPbI_3$, at a ratio of $MAI:PbI_2=1:1.05$ (molar ratio), with a concentration of 1 mol/L, and DMF solvent: Baidu Nhomakorabea (DMSO)=9:1 (volume ratio). After annealing, a Spiro-OMeTAD hole transport layer is prepared by spinning and coating. Finally, an electrode is vaporized to obtain a cell sheet. The specific steps of electrode evaporation are provided as follows:
  a) A metal electrode material of gold is heated to 1040° C. to 1064° C. at a pressure of $5 \times 10^{-3}$ Pa, so as to make the metal electrode material of gold approaches or becomes a molten state;
  b) A melt of gold obtained at step a) is bombarded at low energy of 80 ev by using the Hall ion source, so that it is sputtered and deposited on a surface of the transport layer of the substrate to form a gold electrode film layer with a thickness of 100 nm.

A temperature of a chamber and a temperature of the substrate are detected during the sputtering and deposition process, and the results are that the temperature of the chamber is 62.2° C., and the temperature of the substrate is 61.4° C.

Example 3

A PEDOT:PSS hole transport layer is prepared by a spin coating process. The perovskite material layer is prepared by a scraping process, a precursor of perovskite is $FA_{0.75}MA_{0.25}PbI_3$, with a concentration of 1.2 mol/L, using DMF solvent. After annealing, the C60 electron transport layer is prepared by an evaporation process. Finally, an electrode is vaporized to obtain a cell sheet. The specific steps of electrode evaporation are provided as follows:

a) A metal electrode material of silver is heated to 940° C. to 961° C. at a pressure of $1 \times 10^{-3}$ Pa, so as to make the metal electrode material of silver approaches or becomes a molten state;
b) A melt of silver obtained at step a) is bombarded at low energy of 55 ev by using the Kaufman ion source, so that it is sputtered and deposited on a surface of the transport layer of the substrate to form a silver electrode film layer with a thickness of 120 nm.

The temperature of the chamber and the temperature of substrate are detected during the sputtering and deposition process, and the results are that the temperature of the chamber is 56.2° C., and the temperature of the substrate is 55.4° C.

Comparison Example 1

The same batch of cells prepared by the method in Example 1 are prepared by using the conventional thermal evaporation process for copper electrodes with the same thickness of 150 nm in the preparation of metal electrodes. After detection, the temperature of the chamber is 81.3° C., and the temperature of the substrate is 80.2° C.

Comparison Example 2

The same batch of cells prepared by the method in Example 2 are prepared by using the conventional thermal evaporation method for gold electrodes with the same thickness of 100 nm in the preparation of metal electrodes. After detection, the temperature of the chamber is 75.6° C., and the temperature of the substrate is 76.3° C.

Comparison Example 3

The same batch of cells prepared by the method in Example 3 are prepared by using the conventional thermal evaporation method for silver electrodes with the same thickness of 120 nm in the preparation of metal electrodes. After detection, the temperature of the chamber is 67.3° C., and the temperature of the substrate is 66.7° C.

Cell Sheet Efficiency Test

A 3A grade steady-state solar simulator and an I-V test system are used to test the efficiency of the same batch of cells prepared in Examples 1 to 3 and Comparison Examples 1 to 3. Four samples are selected and tested for each of Examples and Comparison examples, and the test results are described in detail in Table 1.

TABLE 1

| | | | | | | | | | | |
|---|---|---|---|---|---|---|---|---|---|---|
| | \multicolumn{10}{c}{Cell sheet efficiency comparison results} |
| | number | Voc(V) | Isc (mA) | FF (%) | POE | number | Voc(V) | Isc (mA) | FF (%) | POE |
| Example 1 | 1-1 | 1.04 | 207 | 65 | 15.55 | 1-3 | 1.02 | 203 | 67.1 | 15.43 |
| | 1-2 | 1.1 | 209 | 66.7 | 17.04 | 1-4 | 1.07 | 213 | 68.3 | 17.3 |
| Comparison Example 1 | 1-5 | 1.01 | 196 | 64.3 | 14.14 | 1-7 | 0.99 | 201 | 65 | 14.37 |
| | 1-6 | 1.02 | 198 | 63.9 | 14.34 | 1-8 | 1.01 | 203 | 66.3 | 15.1 |
| Example 2 | 2-1 | 1.02 | 203 | 64.3 | 14.7 | 2-3 | 1.01 | 202 | 66.4 | 15.05 |
| | 2-2 | 1.03 | 200 | 63.8 | 14.6 | 2-4 | 1.02 | 205 | 67.3 | 15.63 |
| Comparison Example 2 | 2-5 | 1.01 | 200 | 65.1 | 14.61 | 2-7 | 1 | 199 | 63.2 | 13.97 |
| | 2-6 | 1.02 | 197 | 62.9 | 14.04 | 2-8 | 1.01 | 202 | 64.7 | 14.67 |
| Example 3 | 3-1 | 1.06 | 213 | 66.1 | 16.58 | 3-3 | 1.05 | 219 | 69 | 17.63 |
| | 3-2 | 1.04 | 211 | 67.3 | 16.41 | 3-4 | 1.07 | 216 | 68.6 | 17.61 |
| Comparison Example 3 | 3-5 | 1.01 | 200 | 65.7 | 14.74 | 3-7 | 1.02 | 210 | 66.8 | 15.89 |
| | 3-6 | 1.03 | 204 | 64.9 | 15.15 | 3-8 | 1.03 | 208 | 67 | 15.95 |

Based on the data in Table 1, it may be seen that the cell efficiency is improved when the metal electrode is prepared by the method of the present disclosure, which implicitly confirms that the damage to the perovskite cell film layer is relatively low when the electrode is prepared by the method of the present disclosure.

The above-mentioned description of embodiments is only for the purpose of assisting in understanding the method of the present disclosure and its core ideas. It should be noted that for those skilled in the art, improvements and modifications that can be made to the present disclosure without departing from the principles of the present disclosure, and these improvements and modifications also fall within the scope of protection of the claims of the present disclosure. The foregoing description of the disclosed embodiments enables those skilled in the art to implement or use the present disclosure, and a variety of modifications to these embodiments will be apparent to those skilled in the art. The general principles defined herein may be implemented in other embodiments without departing from the spirit or scope of the present disclosure. Therefore, the present disclosure will not be limited to those embodiments shown herein, but will be subject to the widest scope consistent with the principles and novelty features disclosed herein.

What is claimed is:
1. A method for preparing an electrode film layer on a surface of a solar cell substrate, comprising:
   a) obtaining a metal electrode material melt by heating and melting a metal electrode material under a vacuum condition;
   b) bombarding the metal electrode material melt with an ion source at low energy, so that it is sputtered and deposited on the surface of the solar cell substrate to form the electrode film layer; wherein energy of low energy bombarding is 30 eV to 80 eV.

2. The method of claim 1, wherein at step a), the vacuum condition is $5\times10^{-5}$ Pa to $5\times10^{-3}$ Pa.

3. The method of claim 2, wherein at step a), the vacuum condition is $1\times10^{-4}$ Pa to $1\times10^{-3}$ Pa.

4. The method of claim 1, wherein at step a), the metal electrode material is one or more of gold, silver, copper, iron, aluminum, cadmium, molybdenum, titanium, tin, tungsten, zinc, gallium, germanium, arsenic, selenium, rhodium, palladium, indium, antimony, osmium, iridium, platinum, thallium, bismuth, and polonium.

5. The method of claim 4, wherein at step a), the metal electrode material is one or more of gold, silver and copper.

6. The method of claim 1, wherein at step b), the ion source is an argon plasma source, a Hall ion source or a Kaufman ion source.

7. The method of claim 1, wherein at step b), the solar cell substrate is a substrate provided with a perovskite material layer.

8. The method of claim 7, wherein at step b), the solar cell substrate comprises a hole transport layer, the perovskite material layer, and an electron transport layer that are in contact with each other.

9. The method of claim 1, wherein at step b), a deposition thickness is 50 nm to 300 nm.

10. The method of claim 9, wherein at step b), the deposition thickness is 100 nm to 200 nm.

11. The method of claim 1, wherein at step a), a heating and melting temperature is greater than a melting temperature of the metal electrode material under the vacuum condition, and less than a boiling temperature of the metal electrode material under the vacuum condition.

12. The method of claim 11, wherein in case that the metal electrode material is copper, the heating and melting temperature is 1060° C. to 1082° C.

13. The method of claim 11, wherein in case that the metal electrode material is gold, the heating and melting temperature is 1040° C. to 1064° C.

14. The method of claim 11, wherein in case that the metal electrode material is silver, the heating and melting temperature is 940° C. to 961° C.

* * * * *